United States Patent
Falcon et al.

(10) Patent No.: US 12,281,892 B2
(45) Date of Patent: Apr. 22, 2025

(54) DETERMINING COMPONENT HEIGHT DEVIATIONS

(71) Applicant: ASMPT SMT SINGAPORE PTE. LTD., Singapore (SG)

(72) Inventors: Tom Falcon, Yeovil (GB); Simon Stuart Pape, Yeovil (GB)

(73) Assignee: ASMPT SMT SINGAPORE PTE. LTD., Singapore (SG)

( * ) Notice: Subject to any disclaimer, the term of this patent is extended or adjusted under 35 U.S.C. 154(b) by 718 days.

(21) Appl. No.: 17/534,522

(22) Filed: Nov. 24, 2021

(65) Prior Publication Data

US 2022/0192031 A1    Jun. 16, 2022

(30) Foreign Application Priority Data

Dec. 15, 2020 (GB) .................................. 2019749

(51) Int. Cl.
*G01B 13/06* (2006.01)
*G01B 5/14* (2006.01)
*G01B 21/02* (2006.01)

(52) U.S. Cl.
CPC .............. *G01B 13/065* (2013.01); *G01B 5/14* (2013.01); *G01B 21/02* (2013.01); *H05K 2203/0139* (2013.01)

(58) Field of Classification Search
CPC ......... G01B 13/065; G01B 5/14; G01B 21/02
USPC ....................................................... 702/166
See application file for complete search history.

(56) References Cited

U.S. PATENT DOCUMENTS

| | | | |
|---|---|---|---|
| 2008/0120044 A1* | 5/2008 | Hoysan | G01B 5/20 702/41 |
| 2009/0205569 A1 | 8/2009 | Perault et al. | 118/713 |
| 2009/0293265 A1* | 12/2009 | Inoue | H05K 13/082 29/739 |
| 2012/0015457 A1 | 1/2012 | Rawlinson et al. | 438/15 |
| 2017/0354068 A1* | 12/2017 | Yamamoto | H05K 13/0069 |
| 2020/0348367 A1* | 11/2020 | Koo | G01N 21/956 |
| 2020/0352069 A1* | 11/2020 | Koo | H05K 13/081 |
| 2020/0359537 A1 | 11/2020 | Morita et al. | |

FOREIGN PATENT DOCUMENTS

| | | |
|---|---|---|
| CN | 101999258 A | 3/2011 |
| CN | 111912343 A | 11/2020 |
| EP | 3737217 A1 | 11/2020 |
| JP | 2002-019071 A | 1/2002 |
| JP | 2012-061607 A | 3/2012 |
| JP | 2018-069467 A | 5/2018 |
| JP | 2020-186932 A | 11/2020 |
| WO | WO 2018/051495 A1 | 3/2018 |

* cited by examiner

*Primary Examiner* — Ricky Go
(74) *Attorney, Agent, or Firm* — OSTROLENK FABER LLP

(57) ABSTRACT

Heights of components or parts thereof are measured within a printing machine by measuring their relative rather than absolute heights. A virtual surface may be constructed from the measured heights, with a tolerance level employed based on the virtual surface. The invention is particularly suited to measurement of tooling components within a printing machine, such as tooling pins.

10 Claims, 3 Drawing Sheets

DETERMINING COMPONENT HEIGHT DEVIATIONS

This invention relates to a component height sensing system, a printing machine, a method of determining height deviations of component locations within a machine and a tooling pin placement method.

BACKGROUND AND PRIOR ART

Most printed circuit board assemblies (PCBAs) are manufactured using a method commonly known as Surface Mount Technology (SMT). The SMT process starts with the deposition of solder paste onto a pre-fabricated 'bare' workpiece, such as a circuit board. The solder paste deposition method most commonly used is stencil printing. During a stencil printing process a straight-edged squeegee blade angled with respect to a metal stencil pushes solder paste across the surface of the stencil. The stencil includes apertures arranged to correspond with the locations of components to be soldered to the printed circuit board (PCB). To keep the squeegee in contact with the stencil, a downward force is applied to the squeegee of approximately 10N force for every 50 mm of squeegee blade length. The combination of the squeegee blade angle, the squeegee's lateral force across the stencil, and the down-force onto the squeegee pushes solder paste through the apertures onto the workpiece, thereby "stencil printing" solder paste. Similar techniques may be used to print other forms of print medium, such as adhesive or conductive inks. While the present invention is equally applicable to the printing of all such print media, for convenience for following discussion will refer to the printing of solder paste only.

To prevent non-uniformity and poor repeatability of paste deposition during the stencil printing process, it is necessary to provide planar support to the underside of the workpiece. This support can most commonly take the form of an array of tooling pins, or a purpose-built tooling plate, either of which can be mounted onto a planar horizontal upper surface of a tooling table located within the printer. Tooling pins may be automatically placed on, removed from or rearranged on the tooling table as required, to suit a variety of different shapes, sizes and types of workpieces to be printed. Such automated pin placement systems may for example employ a pin picking tool mounted on a gantry above the tooling table. A simple exemplary pin placement system in schematically shown from above in FIG. 1. A tooling table 1 comprises a flat, planar surface extending in the horizontal plane, i.e. parallel to the X-Y plane as shown. A magazine 2 is provided proximate to the tooling table 1. The magazine 2 includes a plurality of bays 3, each bay 3 for receiving a respective tooling pin 4. In total, eight tooling pins 4 are shown in FIG. 1, with two of these pins 4A, 4B located in respective bays 3 in the magazine 2, and the remaining pins 4C-H placed onto the tooling table 1. In use, the pins 4 may be stored in the magazine 2, and placed onto the tooling table 1 by a picking tool (not shown) on a gantry (not shown) in accordance with a placement plan which may be chosen by a customer or automatically derived based on data (e.g. Gerber data) of the workpiece to be printed, as is generally well-known in the art.

One possible failure mode for such systems may occur if a pin is placed onto an area of the tooling table which already contains some debris or solder paste contamination, in which case the top of the pin may be higher than the other pins. Consequently, during the printing operation, this relatively high pin will locally raise the workpiece and stencil above the intended or optimum printing plane such that the majority of the down force applied to the squeegee will be borne by a very small area of the stencil/workpiece/pin, instead of being evenly spread across the whole print area, supported by a multitude of pins. This may damage the workpiece, stencil or squeegee and may lead to poor print uniformity. In FIG. 1, three areas of debris 5A, 5B and 5C are shown on the tooling table 1.

To mitigate against such a failure mode, and to maintain the required level of automation, it would be advantageous to quickly and accurately check the height of each pin. Since the horizontal or X-Y position of each pin on the tooling table is known in an automated system, a potential method would be to use a distance sensor, mounted on the same gantry as the placement head, that compares the height of the top surface of the pin with the height of the tooling table immediately adjacent to the same pin. This would give an absolute height measurement for every pin, and so the height uniformity of all pins could theoretically be confirmed. Unfortunately there is a problem with this approach as there could be debris or contamination in the area of the tooling table to be measured, which would give an incorrect measurement of tooling table height, and therefore pin height. In FIG. 1 for example, pins 4E, 4F and 4G are all adjacent an area of debris 5A, and therefore the heights of these pins might not be measurable accurately. Pin 4H meanwhile is placed on top of an area of debris 5B, and so it would be expected that this pin would have a greater height. However, this greater height might not be detectable due to the presence of an adjacent area of debris 5C. Other potential sources of measurement error include deviations from planarity of the tooling table 1, and variations in the height of the sensor as it travels with the gantry.

While, as set out above, there are particular problems with measuring the heights of tooling pins within machines, other parts of machines are also problematic to monitor for similar reasons. In particular, printing machines have a general problem that printing material such as solder paste is liable to foul many different parts of the machine, making accurate height measurement within a machine difficult.

The present invention seeks to provide an improved methodology for monitoring, and where appropriate correcting the heights of components within machines, such as, but not limited to, printing machines. The present invention has particular application to tooling pins, so that tooling pin height may be measured and the position of incorrectly-placed pins corrected if required, resulting in fewer print defects and less risk of damage to the printing apparatus. However, the invention is equally applicable to monitoring other components, and specific examples are provided below.

In accordance with the present invention this aim is achieved by measuring relative component heights, rather than measuring the absolute height of those components.

SUMMARY OF THE INVENTION

In accordance with a first aspect of the present invention there is provided a component height sensing system for a printing machine, comprising:

a height sensor operative to measure the relative heights of at least three component locations relative to the height sensor and output measured relative height information, and a control means for receiving the measured relative height information from the height sensor and determining, from the received relative height information, the heights of each of the at least three component locations relative to the others of the at least three component locations.

In accordance with a second aspect of the present invention there is provided a printing machine comprising the component height sensing system of the first aspect.

In accordance with a third aspect of the present invention there is provided a method of determining height deviations of component locations within a machine, comprising the steps of:
i) using a height sensor to measure the relative heights of at least three component locations relative to the height sensor,
ii) determining, from the measured relative heights, the heights of each of the at least three component locations relative to the others of the at least three component locations, and
iii) identifying height deviations of any component locations by analysing the heights of each of the at least three component locations relative to the others of the at least three component locations determined in step ii).

In accordance with a fourth aspect of the present invention there is provided a tooling pin placement method comprising the method of determining height deviations of the third aspect, comprising the step:
iv) where a tooling pin located at a first location on a tooling table is determined to have a height deviation, moving the tooling pin from the first location to a second, spatially separated, location.

Other specific aspects and features of the present invention are set out in the accompanying claims.

BRIEF DESCRIPTION OF THE DRAWINGS

The invention will now be described with reference to the accompanying drawings (not to scale), in which.

DETAILED DESCRIPTION OF THE PREFERRED EMBODIMENTS OF THE INVENTION

Figure 1:
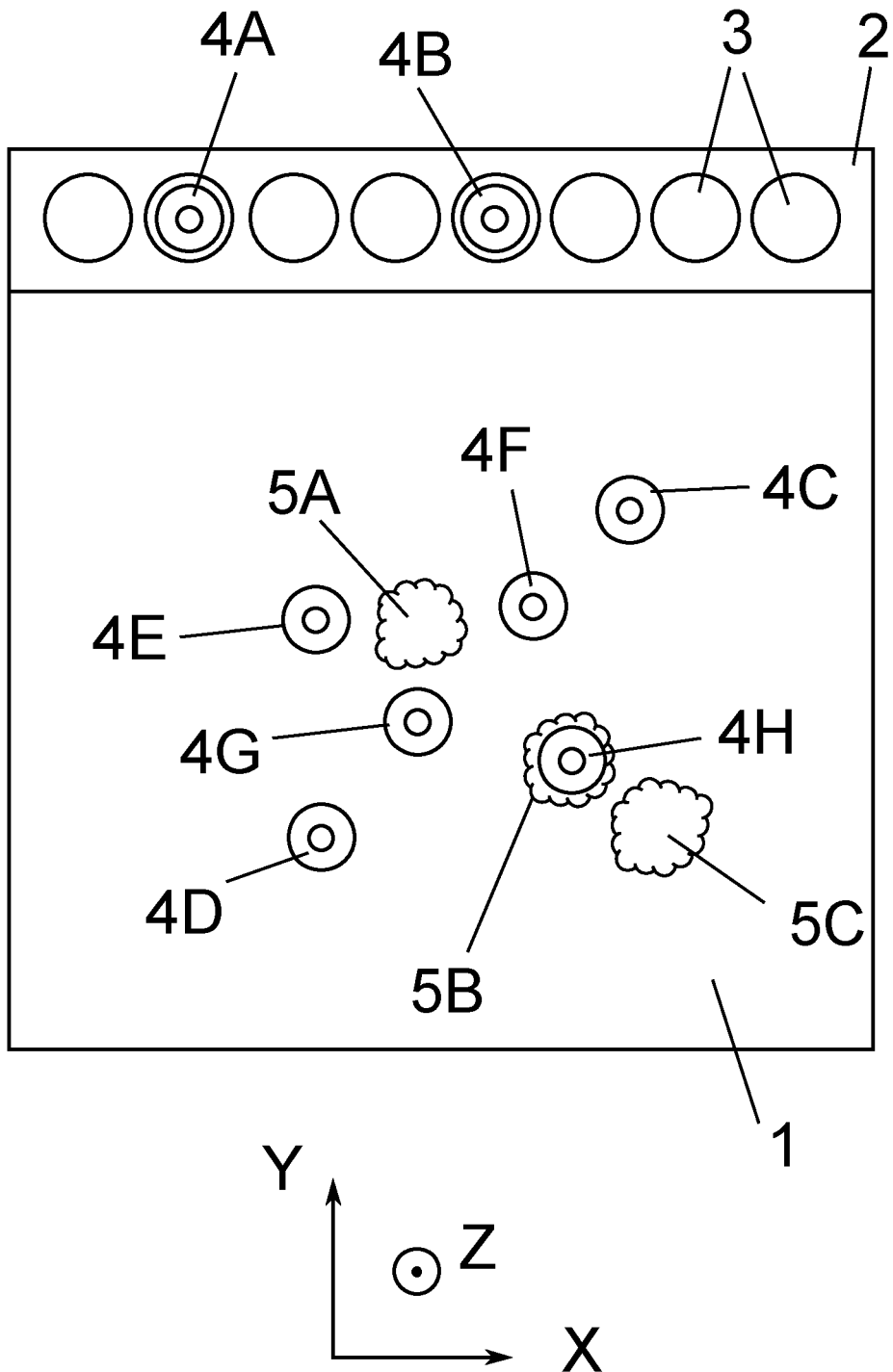
FIG. 1 schematically shows a known tooling pin placement system from above.
Figure 2:
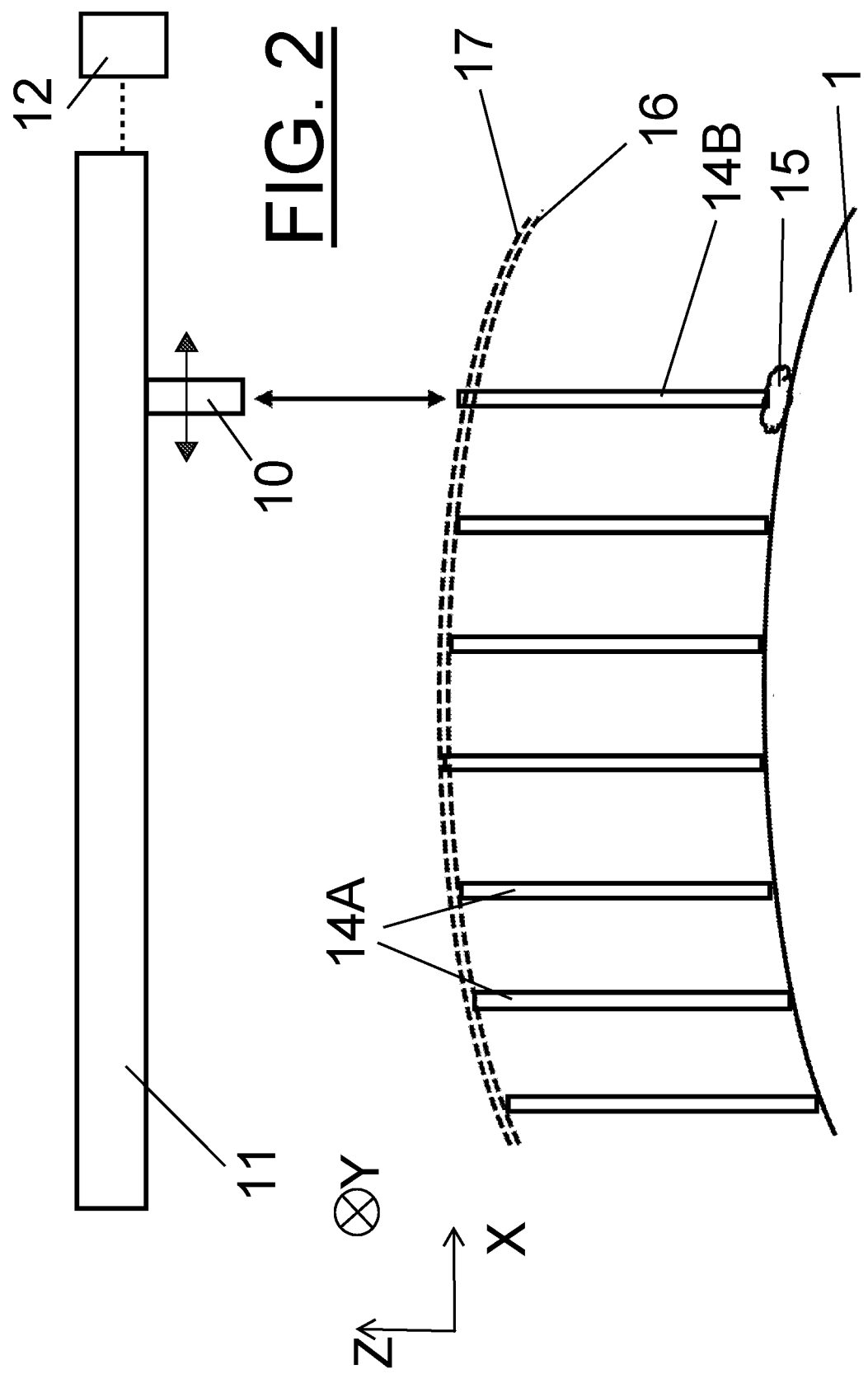
FIG. 2 schematically shows a side view of a tooling pin placement system in accordance with an embodiment of the present invention.

FIG. 2 schematically shows a side view of a tooling pin placement system in accordance with an embodiment of the present invention. The apparatus is generally similar to that illustrated in FIG. 1. A tooling table 1 is shown with a plurality of tooling pins 14A, 14B placed thereon. It is to be understood that while the upper surface of the tooling table 1 is advantageously planar and flat, for the sake of example it is shown in FIG. 2 as being highly non-planar. A height sensor 10 having a substantially linear sensing axis is mounted on a gantry 11 above the tooling table 1 so that it is operative to 'look down' at the tooling table 1 and any pins 14A, B placed thereon, and thereby output a signal indicative of the vertical (i.e. parallel to the Z-axis as shown) distance between the sensor 10 and a surface directly below it. The sensor 10 could for example comprise an ultrasonic sensor, laser sensor or well-known alternatives. The sensor 10 is movable relative to the gantry 11 parallel to the horizontal X-axis as shown, while the gantry 11 itself is movable relative to the tooling table 1 parallel to the horizontal Y-axis. In this way, by suitable movement of the gantry 11 and/or sensor 10 parallel to the X/Y axes the sensor 10 may be positioned over any horizontally-separated positions of the tooling table 1 to measure the distance to a point directly below. Operation of the gantry 11 and sensor 10 is effected by a control means 12 such as a computer, processor or similar, running a suitable hard- or soft-coded control program, as is generally known in the art.

With the pin placement shown in FIG. 2, a plurality, here six, pins 14A are shown correctly placed on the tooling table 1. However, a seventh pin 14B is shown incorrectly placed, as it is standing on top of debris 15, and therefore extends higher than it should for optimal printing performance. While the sensor 10 could be used to determine the distance between itself and the pin 14B, since the vertical position of the sensor 10 is itself subject to error due to tolerance of the gantry 11, to accurately to determine the height of an object below it, it is necessary to also measure the distance to a point of known height, such as the tooling table 1. As described previously with reference to FIG. 1 however, it is not possible to do this with confidence, due to the possibility of debris being located on the tooling table 1, or possible deviations from flatness of the tooling table 1.

In accordance with the present invention, this problem is overcome by using the sensor 10 to measure the relative heights of at least three component locations, such as pins 14A, B relative to the height sensor and output measured relative height information to the control means 12. This measurement may be performed immediately following placement of each tooling pin, though it is possible to place all the tooling pins before measuring all of the tooling pins. The control means 12 may then determine from the received relative height information, the heights of each of the at least three component locations relative to the others of the at least three component locations. By using relative pin heights only, the level of flatness of the tooling table (affected by the presence of debris, flatness deviations of the tooling table itself or from any other effect which creates discrepancies in the flatness of the tooling table as viewed from above) and deviations in the absolute height of the sensor 10 are both "filtered out" from the tooling pin height deviation determination, and so the height of the tooling table 1 need not be measured directly. In the example shown in FIG. 2 therefore, the sensor 10 would be moved to measure the heights of each tooling pin 14A, 14B, either following placement of all of the tooling pins, or alternatively following placement of each tooling pin. Once all of the heights have been measured, they can be compared to determine outliers, which suggest incorrect placement. It will be understood by those skilled in the art that it is necessary to measure at least three component heights since this is the minimum number which enables an outlier to be identified—if only two heights were measured and these were significantly different, it would not be possible to confirm from this information alone which height was indicative of an error. Preferably, and as illustrated in FIG. 2, the control means is operative to map the received measured relative height information to a virtual surface 16. Advantageously, the virtual surface 16 could for example be created via a one-time set-up or calibration procedure on a known, clean tooling table 1.

The control means 12 may then compare the measured relative heights to a predetermined tolerance level 17, which reflects the amount of tolerance permissible so that the height of a measured component is deemed to be 'compliant', i.e. within acceptable bounds for the particular application. In practice, the tolerance level 17 could for example be based on combined and weighted tolerances of the tooling table flatness and the pin height variation.

In the embodiment of FIG. 2, the tolerance level 17 is set to follow the virtual surface 16, i.e. so that at any point of the tooling table 1 the tolerance level 17 is a constant height above the virtual surface 16 at that same point. Pins 14A all have determined heights below the tolerance level 17 and are therefore considered to be 'conforming pins' within acceptable limits. The detected height of pin 14B however lies above the tolerance level 17, showing a non-acceptable height deviation, and is therefore considered to be a 'non-conforming pin'.

In other embodiments (not shown), the tolerance level 17 could be localised, and the level at any particular horizontal position calculated from an average of only the detected heights of tooling pins within a preselected horizontal radius of that horizontal position.

Summarising the preferred method, the following steps are performed:
i) at least three tooling pins are placed on a tooling table;
ii) the relative heights of the placed tooling pins are measured;
iii) a virtual surface is created from those measured relative heights;
iv) a tolerance level is created based on the virtual surface; and
v) the relative heights of placed tooling pins are measured and compared to the tolerance level.

With this specific embodiment, hereafter referred to as 'Embodiment A', unacceptable deviations in the height of tooling pins can be determined at any time during an overall printing process, and there is no need for a 'control' measurement to be taken.

Figure 3A:
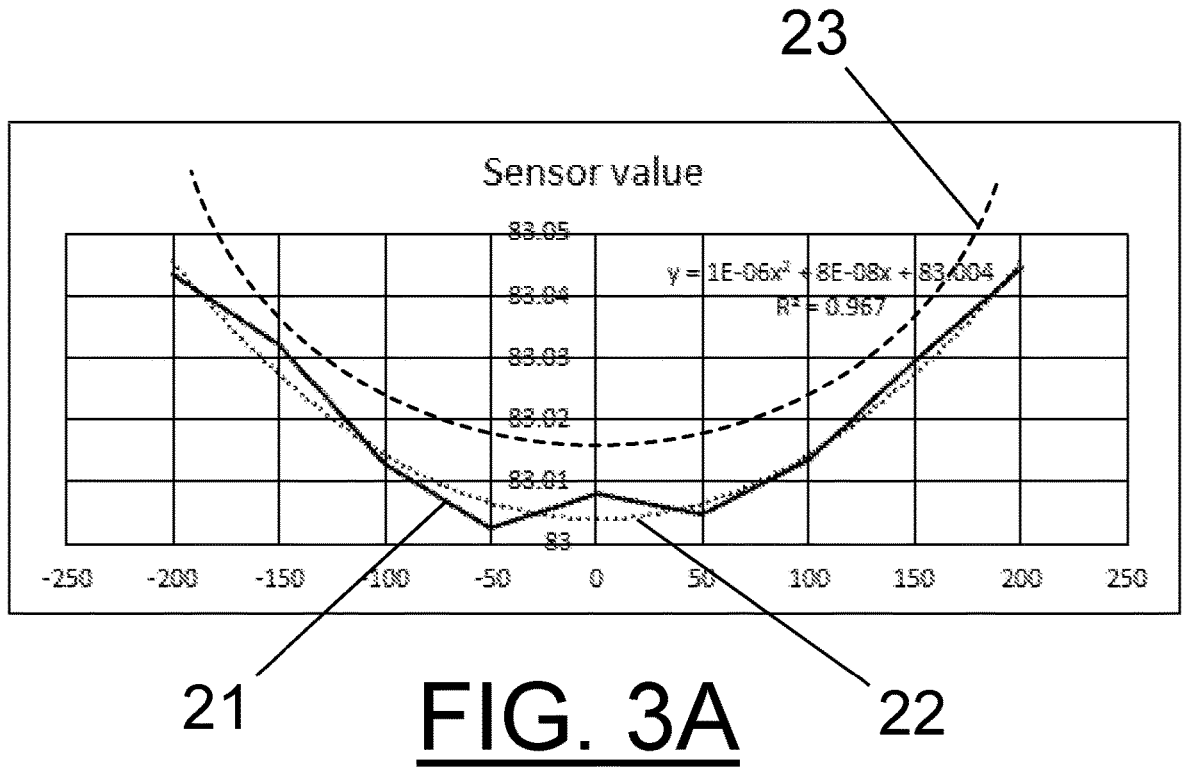
FIGS. 3A and 3B schematically show two-dimensional virtual surfaces for conforming and non-conforming tooling pin arrays respectively.
Figure 3B:
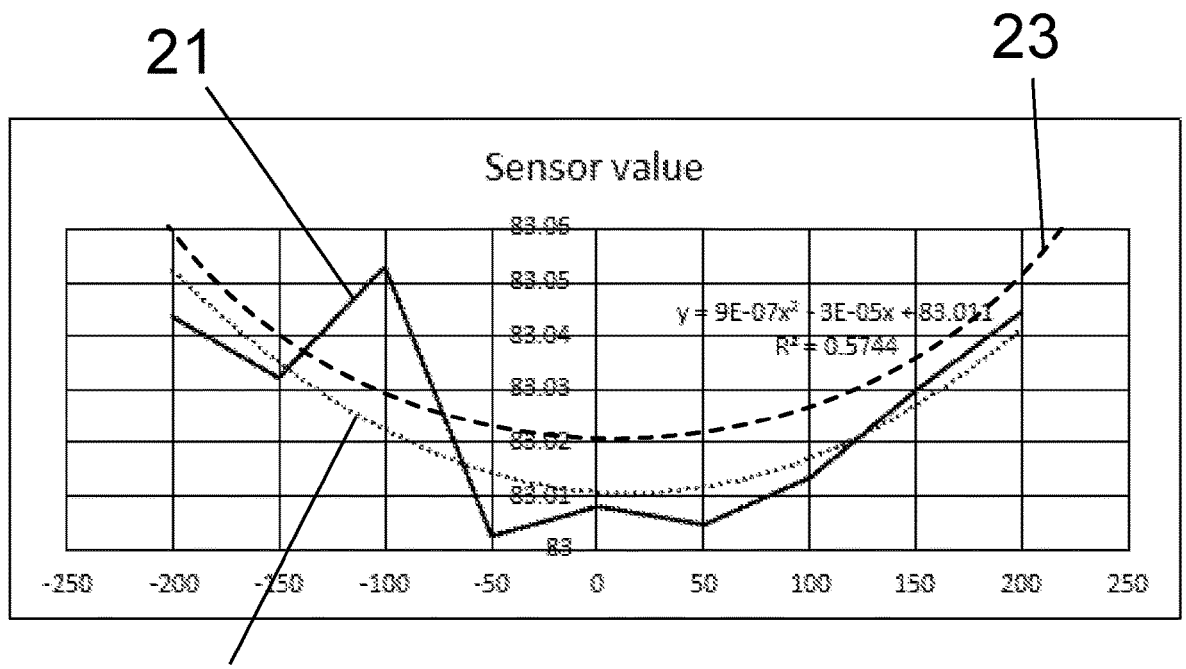

The construction and use of a virtual surface is illustrated in FIGS. 3A, 3B, which graphically show a two-dimensional virtual surface constructed by measuring the heights of a linear array of nine tooling pins, taken from a computer simulation. In FIGS. 3A and 3B, the tooling pins are arranged 50 mm apart, with the central tooling pin being considered to coincide with the position X=0. With the equipment used, there is a bow to at least one of the tooling table and sensor gantry. Since, as will be seen, this non-planarity is filtered out, it does not matter which component is bowed. In FIG. 3A, every tooling pin has a height of 83.0 mm. Table 1 sets out the relevant parameters for this test situation:

TABLE 1

Parameters for FIG. 3A

| X (mm) | Pin Height (mm) | Table/sensor gantry bow (mm) | Experinnental error (mm) | Sensor value (mm) |
|---|---|---|---|---|
| −200 | 83 | 0.04 | 0.00368 | 83.04368 |
| −150 | 83 | 0.0225 | 0.00954 | 83.03204 |
| −100 | 83 | 0.01 | 0.00298 | 83.01298 |
| −50 | 83 | 0.0025 | 0.00004 | 83.00254 |
| 0 | 83 | 0 | 0.00815 | 83.00815 |
| 50 | 83 | 0.0025 | 0.00235 | 83.00485 |
| 150 | 83 | 0.01 | 0.00378 | 83.01378 |
| 200 | 83 | 0.0225 | 0.00719 | 83.02969 |
| 250 | 83 | 0.04 | 0.00453 | 83.04453 |

FIG. 3A is a graph of Sensor value (Y axis) against X, with the plotted solid line 21 is the plot of measured heights. The plotted dashed line 22 shows the virtual surface, being a 'best fit' quadratic equation (here $y=1E-06x^2+8E-08x+83.004$) derived from the measured heights. The goodness of fit $R^2=0.967$, so it can be seen that the measured heights follow the virtual surface well. The dashed line 23 shows a tolerance level chosen to follow the virtual surface 22 but 0.01 mm above it. It can be seen that the measured height plot 21 does not cross above the tolerance level 23, and so all of the placed tooling pins here would be considered conforming.

FIG. 3B is similar to FIG. 3A, except that here one of the tooling pins has a +40 μm height error. The relevant parameters are set out in Table 2:

TABLE 2

Parameters for FIG. 3B

| X | Pin Height (mm) | Table/sensor gantry bow (mm) | Experimental error (mm) | Sensor value (mm) |
|---|---|---|---|---|
| −200 | 83 | 0.04 | 0.00368 | 83.04368 |
| −150 | 83 | 0.0225 | 0.00954 | 83.03204 |
| −100 | 83.04 | 0.01 | 0.00298 | 83.05298 |
| −50 | 83 | 0.0025 | 0.00004 | 83.00254 |
| 0 | 83 | 0 | 0.00815 | 83.00815 |
| 50 | 83 | 0.0025 | 0.00235 | 83.00485 |
| 150 | 83 | 0.01 | 0.00378 | 83.01378 |
| 200 | 83 | 0.0225 | 0.00719 | 83.02969 |
| 250 | 83 | 0.04 | 0.00453 | 83.04453 |

The best-fit curve equation of the virtual surface 22 changes as a result (here $y=9E-07x^2-3E-05x+83.011$), and the goodness of fit $R^2=0.5744$, which is a significant reduction. It can be seen that the tooling pin located at x=−100 deviates noticeably from the virtual surface 22. The measured pin height at the x=−100 position crosses above the tolerance level 23, and so this pin would be identified as non-conforming.

In an alternative embodiment, step i) above is performed while the at least three tooling pins are placed on a clean tooling table (so acting as a 'control' measurement), and in step v) the relative heights of placed tooling pins are measured and compared to the tolerance level during a 'live' placement process subsequent to the pin placement of step i), in which live placement process the tooling table need not be clean. This specific embodiment, hereafter referred to as 'Embodiment B', may lead to more accurate identification of height discrepancies of the placed tooling pins caused by debris, but takes additional time. It will be understood by those skilled in the art however that although a control measurement will be free from deviations caused by debris on the tooling table, the control measurement will still be subject to deviations caused by, for example, non-planarity of the tooling table itself, deviations in gantry/sensor height across its range of movement, debris stuck to the bottom of tooling pins etc.

In an further embodiment, the Embodiments A and B above may be combined, so that Embodiment B is performed when the tooling table 1 is clean, for example at the start of a printing operation or following a cleaning operation of the tooling table 1, while Embodiment A is performed one or more times during the printing operation.

Although in FIG. 2 only a single tolerance level 17 is shown, being above the virtual surface 16, it is equally possible to define a second tolerance level below the virtual surface 16, forming a tolerance band encompassing the virtual surface, so that component heights either higher or lower than this tolerance band are identified as non-conforming. For example, a tooling pin height may be lower than expected, and therefore non-conforming, if it is partially placed on a piece of debris and so is orientated somewhat inclined to the vertical direction.

With all of the above embodiments, it is possible, having identified non-conforming tooling pins, to take corrective action. For example, detection of a non-conforming pin by the control means 12 could trigger it to instruct the pin picking tool to remove the non-conforming pin 14B from the tooling table 1 to avoid damaging a workpiece placed thereon. The removed pin may be moved to a different location, which hopefully does not have any debris thereon, which of course can be verified by repeating the pin's height measurement and comparison to the tolerance level 16. Alternatively or additionally, a cleaning routine may be triggered, in which, for example, the identified non-conforming pin is wiped to remove any debris attached thereto. The surface of the tooling table 1 may also be cleaned in the vicinity of the location of the non-conforming pin. If, for example, it is not possible to perform a cleaning operation, then the location of the non-conforming pin may be identified as an 'exclusion zone' so that pins may not be placed there until that location has been determined to be clean, either through the performing of a cleaning operation or through further investigation. Where a location is marked as an 'exclusion zone', this may be highlighted within a graphical user interface (GUI) controlled by the control means 12 and visible to an operator. The zone would be cleared from the GUI when the location has been determined to be clean.

The heights of tooling pins stored in the magazine may equally be measured using a similar methodology, for example before commencement of a pin placement operation. If any tooling pins are detected with a height deviation, this may indicate that some debris has entered the respective bay of the magazine, and again that a cleaning operation should be performed.

The above-described embodiments are effective at detecting tooling pin heights so as to be non-conforming. However, the inventive methodology can be extended to a wide variety of different usage cases.

For example, instead of detecting the height of discrete components such as tooling pins, it is equally possible to detect the height of different parts of a relatively large component. As a specific example, it is possible to measure the heights of parts of a tooling pin magazine itself, to check that the magazine is seated correctly before placing a tooling pin therein or removing a pin therefrom.

Other types of tooling may also be analysed in similar ways. For example, using the methodology of the present invention, it is possible to measure and monitor the flatness, coplanarity and deviation of, for example, dedicated tooling blocks, or individual tooling towers for singulated substrates, or any substrates located on such tooling towers. For tooling towers which are capable of movement, moving parts thereof can be checked to ensure they are moving and homing correctly. Deviations can be reported to the user, and maintenance or end-of-life predictions can be made based on the data produced.

The inventive methodology can yet further be extended to a wide variety of different usage cases for printing machines outside of tooling systems. For example, the height and/or coplanarity of clamps for workpieces may be measured and checked, including for example so-called foilless clamps now being employed. These measurements may be used to automatically adjust the height of the tooling table to compensate for different workpiece thicknesses. As an extension, the height of the workpiece itself may be measured using this methodology, and optionally compared to the determined height of the clamps to allow direct compensation for different workpiece thicknesses.

Importantly, the same sensor and control means may be used for any or all of the above-described embodiments.

The above-described embodiments are exemplary only, and other possibilities and alternatives within the scope of the invention will be apparent to those skilled in the art.

REFERENCE NUMERALS USED

1—Tooling table
2—Magazine
3—Bays
4—Tooling pins
5A-C—Debris
10—Sensor
11—Gantry
12—Control means
14A—Conforming pins
14B—Non-conforming pin
15—Debris
16—Virtual surface
17—Tolerance level
21—Measured height plot
22—Virtual surface
23—Tolerance level

The invention claimed is:

1. A printing machine for printing print medium onto a workpiece, comprising a tooling table for receiving a plurality of tooling pins thereon, and
   a component height sensing system,
   the component height sensing system comprising:
   a height sensor operative to measure the relative heights of at least three component locations corresponding to tooling pins relative to the height sensor and output measured relative height information, and
   a control means for receiving the measured relative height information from the height sensor, determining, from the received relative height information, the heights of each of the at least three component locations relative to the others of the at least three component locations and comparing the determined relative height information to a predetermined tolerance level to identify height deviations of any component locations.

2. The printing machine claim 1, wherein the control means is operative to map the received measured relative height information to a virtual surface.

3. The printing machine of claim 1, wherein the height sensor comprises a sensor with a substantially linear sensing axis, mounted to look down at the component locations., optionally the sensor is movably mounted so as to be movable between horizontally-separated positions, with a component location directly below the horizontally-separated positions.

4. A method of determining height deviations of component locations within a printing machine for printing print medium onto a workpiece, said printing machine comprising a tooling table for receiving a plurality of tooling pins thereon, the method comprising the steps of:
   i) using a height sensor to measure the relative heights of at least three component locations corresponding to tooling pins relative to the height sensor,
   ii) determining, from the measured relative heights, the heights of each of the at least three component locations relative to the others of the at least three component locations, and iii) identifying height deviations of any component locations by comparing the heights of each of the at least three component locations relative to the others of the at least three component locations determined in step ii)) to a predetermined tolerance level.

5. The method of claim 4, wherein step ii) comprises mapping the measured relative heights to a virtual surface.

6. The method of claim 4, wherein step iii) comprises comparing the measured relative heights to a predetermined tolerance band to identify height deviations of any component locations, optionally the tolerance band is defined relative to the virtual surface.

7. A tooling pin placement method comprising the method of determining height deviations of claim 4, comprising the step:

iv) where a tooling pin located at a first location on the tooling table is determined to have a height deviation, moving the tooling pin from the first location to a second, spatially separated, location.

8. The method of claim 7, comprising the step of flagging the first location as an error location, and preventing placement of tooling pins at the first location until the first location is determined to no longer be an error location.

9. The method of claim 8, comprising the step of highlighting the error location on a graphical user interface.

10. The method of claim 7, wherein determination of a height deviation in step iv) causes a tooling table cleaning operation to be performed.

* * * * *